March 11, 1969 R. J. WHITTIER 3,432,731

PLANAR HIGH VOLTAGE FOUR LAYER STRUCTURES

Filed Oct. 31, 1966

INVENTOR.
RONALD J. WHITTIER

BY [signature]
[signature]
ATTORNEYS

United States Patent Office 3,432,731

Patented Mar. 11, 1969

3,432,731

PLANAR HIGH VOLTAGE FOUR LAYER STRUCTURES

Ronald J. Whittier, Mountain View, Calif., assignor to Fairchild Camera and Instrument Corporation, Syosset, N.Y., a corporation of Delaware Filed Oct. 31, 1966, Ser. No. 590,778

U.S. Cl. 317—235 7 Claims

Int. Cl. H01l 9/12

This invention relates to an improved high-voltage, multilayered, planar structure having a high breakdown voltage and improved stability. In particular, this invention relates to a double-ring, multilayered planar semiconductor device having a high resistivity region and two critical planar P-N junctions wherein an avalanche current occurs at a particular forward or reverse bias potential referred to as the breakdown voltage.

In previous multilayered semiconductor devices manufactured by the planar process, it has been impossible to achieve breakdown voltages as high as breakdown voltages of multilayered devices formed by the mesa process. Part of the difficulty arises from the shape of the planar P-N junction, which causes higher electric fields to exist at the corners and edges of the diffused junction than across the plane portion of the junction. This condition ordinarily results in devices having a lower breakdown voltage.

Methods for improving the breakdown voltage characteristic in two layer and three layer planar devices have been known. U.S. patent application Ser. No. 506,750, filed Nov. 8, 1965, and assigned to the same assignee as the instant invention refers to the use of a field plate in combination with a sink. Formed from an extension of a metal contact, the field plate acts as an inner ring to control the electrical field applied to the critical planar P-N junction and thus increase the breakdown voltage. The sink, which is located laterally exterior to the field plate, acts as an outer ring to collect charged particles that tend to accumulate in the overlying insulating material and prevents instability from occurring at the surface of the device.

Another U.S. patent application, Ser. No. 544,229, filed Apr. 21, 1966, which is also assigned to the same assignee as the instant invention, refers to a method of optimizing the breakdown voltage by changing the thickness of the overlying insualting material.

However, because multilayer semiconductor structures are different from two or three layer structures, special techniques are required to improve the breakdown voltage. A multilayer structure is defined as having four or more regions of semiconductor material, with each region being of a conductivity type opposite that of the adjacent region. Normally, the multilayer structure is characterized as having a high resistivity region to which two critical planar P-N junctions are adjacent; the corner and edge of one junction being significant when the device is forward biased, and the edge of the other junction being significant when the device is reverse biased. Thus, there are two operating conditions for which breakdown voltage must be considered. Two and three layer structures, on the other hand, have only one critical planar P-N junction, and hence, only one operating condition for which breakdown voltage must be considered, that condition occurring when the device is reverse biased. Because of this basic difference between the two types of structures, separate techniques from those previously known must be used to control the breakdown voltage characteristic of the multilayered structure during forward and reverse bias operation. The invention described herein primarily relates to multilayered semiconductor structures whereby electrical field appearing at the corner and edge of the critical P-N junctions during periods of forward and reverse bias operation can be controlled and higher breakdown voltage achieved. As a secondary feature, the invention relates to a means for collecting charged particles in the overlying-insulating layer of a planar multilayered semiconductor device, so that improved stability is achieved.

Briefly, the multilayered planar semiconductor device of this invention comprises a structure having a first semiconductor region of a first conductivity type with a surface. Located within the first region is a second semiconductor region of the opposite conductivity type, which forms a first P-N junction with the first region, the junction having an edge at the surface. A third semiconductor region of the first conductivity type is located within the second region to form a second P-N junction, with the second junction also having an edge at the surface. Located within the third region is a fourth semiconductor region of opposite conductivity type to form a third P-N junction, with the third junction having an edge at the surface. A layer of insulating, protective material overlies the surface including the edges of the first, second, and third P-N junctions. A first metal contact is ohmically connected to an exposed portion of the first region. Ohmically connected to an exposed portion of the fourth region is a second metal contact. Placed atop the insulating, protective material overlying the edge of the first P-N junction is a first field plate for controlling the electric field at the corner and edge of that junction, the field plate being ohmically connected to the first region. A second field plate is placed atop the insulating, protective material overlying the edge of the second P-N junction for controlling the electric field at the corner and edge of that junction. Also, depending upon the direction of the bias potential, either field plate may collect charged particles in the overlying insulating layer. In alternate embodiments, the first field plate may be an extension of the contact to the first region, the second field plate may be an extension of a contact to the third region, a contact may be ohmically connected to the second region, and a third field plate may be placed atop the insulating material overlying the edge of the third P-N junction.

The invention may be understood better from the following detailed description and the accompanying drawings in which.

Figure 1:
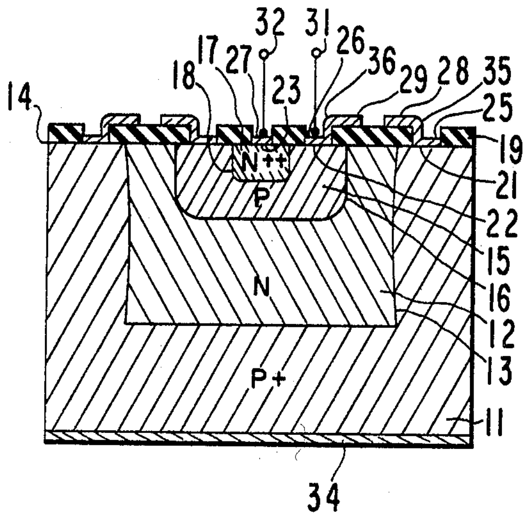
FIG. 1 is a sectional view of the preferred embodiment of the invention.
Figure 2:
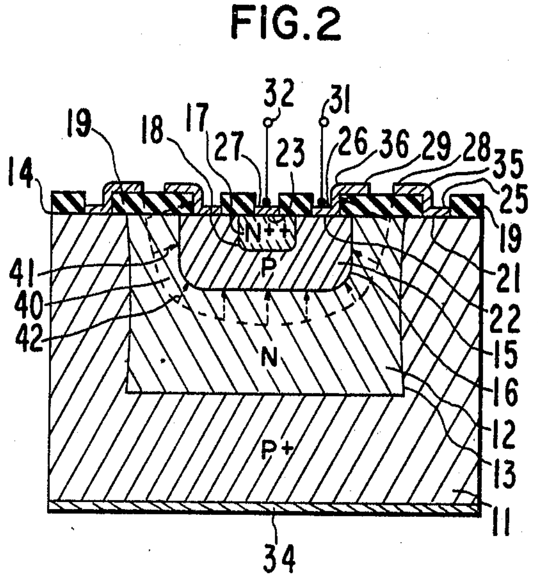
FIG. 2 is a sectional view of the embodiment of FIG. 1 wherein a forward-bias potential is applied to the device and the electrical field created thereby at the critical P-N junction is shown by arrows.
Figure 3:
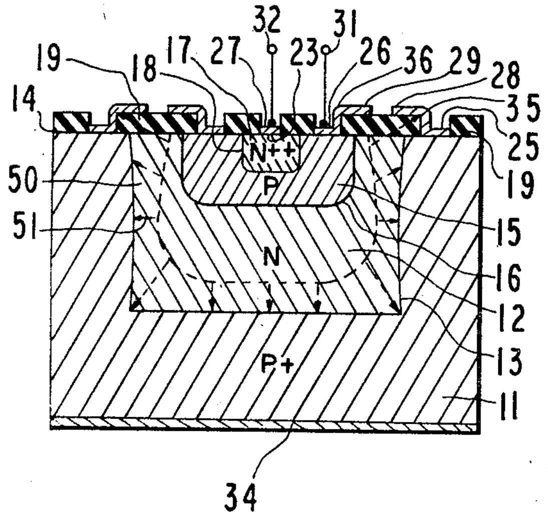
FIG. 3 is a sectional view of the embodiment of FIG. 1 wherein a reverse bias potential is applied to the device and the electrical field created thereby at the critical P-N junction is shown by arrows.

Referring to FIGS. 1, 2, and 3, a multilayered semiconductor device with a passivated surface is shown. For the purpose of explanation, an NPNP structure is used to illustrate the concepts of the invention in the following description. However, the same principles apply to a multilayered PNPN semiconductor structure, except where noted. The device has a first region 11 and a second region 12 disposed within, forming a first P-N junction 13 between the two regions. The first region 11 is of one conductivity type, say, highly doped P-type, and the second region 12 then is of opposite conductivity type, which is N-type. The first P-N junction 13 has an edge extending to the substantially flat surface 14. A third region 15 is disposed within the second region 12 to form a second P-N junction 16; junction 16 is island shaped and also has an edge extending to surface 14. The third region 15 is of a first conductivity type, which, as mentioned above, is P-type. Disposed within the third region 15 is a fourth region 17 forming a third P-N junction 18; junction 18 also has an edge extending to surface 14. The conductivity type of the fourth region 17 is the same as the second region and thus opposite that of the first and third regions. This region too is highly doped N-type.

The upper surface 14 is covered with an insulating, protective layer 19 that passivates the surface. In silicon devices, this layer is preferably an oxide of silicon that is pyrolitically or thermally grown; however, an equivalent material may be employed. Positioned over at least a portion of the surface 14, the insulating layer 19 is formed to expose portions 21, 22, and 23 of the surface of the first, third, and fourth regions 11, 15, and 17, respectively. Contacts, such as the contact metal layers 25, 26, and 27, which are made of suitable conductivity material that is adherent to the semiconductor material and to the insulating layer 19, are intimately attached to the respective exposed portions 21, 22, and 23 of the surface 14. Metallized contact techniques, such as disclosed in U.S. Patent No. 2,981,877, issued to Dr. Robert N. Noyce and assigned to the same assignee as this invention, may be used. Contact layers 25 and 26 include the respective extended portions 28 and 29. These extended portions are formed over the insulating layer 19 and extend laterally beyond the edge of the respective P-N junctions 13 and 16. For example, the extended portion 29 lies atop the insulating layer overlying the depletion region 40 shown in FIG. 2. On the other hand, the extended portion 28 lies atop the insulating layer overlying the depletion region 50 shown in FIG. 3. Leads 31 and 32 are connected to the respective contact layers 26 and 27 for applying potentials to the respective regions 15 and 17. A potential may be applied to region 11 either by contact 34 or through contact 25. Contact 25 is connected to region 11, so that the potential of region 11 extends to contact 25 and portion 28, and a separate lead for contact 25 is not needed (provided the first region 11 comprises high conductivity material). It should be understood that the term "contact," or "contact layer" as used in the specification and claims includes both continuous and discontinuous layers.

Multilayered semiconductor devices usually have a high resistivity region with two critical P-N junctions located adjacent thereto, one P-N junction having a critical breakdown voltage characteristic when the multilayered device is forward biased, and the other P-N junction having a critical breakdown voltage characteristic when the device is reverse biased. For example, in the device shown in FIGS. 1, 2, and 3, the second region 12 is the high resistivity region and the P-N junctions 13 and 16 are critical. When the device is forward biased as shown in FIG. 2, the second P-N junction 16 is reverse biased and the breakdown voltage at this junction is critical. When the device is reverse biased, as shown in FIG. 3, the first P-N junction 13 is reverse biased and the breakdown voltage characteristic at this junction is critical. Note that when the device is reverse biased, the third P-N junction 18 is also reverse biased, but its breakdown voltage characteristic is not critical. This can be understood from the fact that the second region 12 is a lightly doped, N-type region and has a high resistivity, while the fourth region 17 is a highly doped N-type region of low resistivity. As mentioned previously, breakdown voltage is defined as the reverse bias potential applied to the device that is of sufficient magnitude to cause avalanche current to flow. The third P-N junction 18 can break down upon direct application of a reverse bias voltage that is much lower than the reverse bias volage required to cause the first P-N junction 13 to break down. However, in order for avalanche current to flow, the first P-N junction 13 must break down. For this reason, the breakdown voltage characteristic of the third P-N junction 18, which is later to break down, is not the critical parameter when the device is reverse biased.

The electric field created by the application of a potential to the extended portion 29 of contact 26 alters the field incident to the reverse biasing of the second P-N junction 16, so that a higher bias potential may be applied before breakdown at the junction 16 occurs. In a similar manner, when the device is reverse biased, the electrical field created by the application of a potential to the extended portion 28 alters the field at the surface incident to the reverse biasing of the first P-N junction 13. Higher bias potential may be thus applied before the breakdown of junction 13 occurs whenever the breakdown voltage of the first P-N junction 13 is limited by the surface field.

However, used individually, the extended portions 28 and 29 cause charged particles in and on the insulating layer 19 to migrate outwardly or, as the case may be, inwardly and eventually reach and concentrate upon, above, or in the vicinity of the surface 14. This migration tends to create instability and degradation in the operating characteristics of the device. In order to prevent migration and the resulting instability, both extended portions 28 and 29 must be used. Each extended metal layer thus acts as a charged particle sink, collecting charged particles present in the insulating layer 19 and preventing migration of charged particles about the surface 14. For example, when the device is forward biased, the second P-N junction 16 is reverse biased and a sink is formed by the contact layer 25 and the extended portion 28. The extended portion 28, located over the insulating layer 19, is laterally external to and in a symmetrical structure, essentially surrounds contact 26. Contact 25 of the sink is ohmically connected to an exposed portion 21 of the surface 14 over the first region 11, which is a P+ region. In a similar manner, when the device is the reverse biased, the first P-N junction 13 is reverse biased and, thus is the critical junction. A sink is formed by contact 26 with extended portion 29. The extended portion 29 is located over the insulating layer 19 and, as mentioned above, in a symmetrical structure is essentially surrounded by contact 25. Contact 26 is ohmically connected to an exposed portion 22 of the surface 14 over the third region 15, which is a P region. In a symmetrical structure, contact 25 and extended portion 28 form an outer ring 35, while contact 26 and extended portion 29 form an inner ring 36. When the device is forward biased, the inner ring 36 serves to increase the breakdown voltage of the second junction 16 and the outer ring 35 functions to limit the extent and shape of the field produced by contact layer 29. The outer ring 35 also acts as a sink for the charged particles present in the protective layer 19. On the other hand, when the device is reverse biased, the outer ring 35 tends to increase the breakdown voltage of the first P-N junction 13, and the inner ring 36 tends to limit the extent and shape of the field produced by the outer ring 35. Also, during the time the device is reverse biased, the inner ring 36 functions as a sink for the charged particles present in the insulating protective layer 19. In this embodiment of the invention, the extended portions 28 and 29 preferably are composed of a metallic material, such as aluminum or any equivalent metal, having good conductive properties. However, the extended portions 28 and 29 may be composed of a nonmetallic material, provided the material has high conductivity compared to that of the insulating layer 19. In any case, whether metallic or nonmetallic, the material must be adherent to both the insulating layer 19 and the semiconductor surface 14.

Operation of the multilayered planar semiconductor device of this invention will now be considered. In FIG. 2, the device is forward biased when the first region 11 is at a more positive potential than the fourth region 17; for example, a positive potential may be applied to the first region 11 while the fourth region 17 is connected to ground. These applied potentials cause the first P-N junction 13 to be forward biased, the second P-N junction 16 to be reverse baised, and the third P-N junction 18 to be forward biased. A depletion region is created in and around the vicinity of the second P-N junction 16 as indicated by cross-hatching 40. Incident to the creation of the depletion region is the existence of an electric field across this depletion region indicated by the arrows 41. This electric field, when large enough, results in a breakdown condition. A negative (with respect to the second region 12) potential applied to the lead 31 causes the extended portion 29 of the contact layer 26 to create a field in the vicinity of the depletion region 40. This potential alters the usual configuration of the field incident to the depletion region 40 near the second P-N junction 16 in such a manner that the electric field is lower near the corner 42 and near the edge of the surface 14 than it normally is in diffused devices. Because the electric field is lower, extended portion 29 enables high voltages to be applied across the junction 16 before breakdown occurs. Application of an appropriate voltage to the outer ring 35, which is formed in a symmetrical structure by contact layer 25 and extended portion 28, provides a number of advantages. First, the outer ring 35 prevents the depletion region 40 from reaching the first region 11. Second, the outer ring 35 prevents an inversion layer from forming between the first and third regions 11 and 15 under the insulating layer 19 at the surface 14. Third, by collecting positive charges present in the insulating layer 19, the outer ring 35 prevents the positive charges from going to the inner ring 36, which could result in a substantial deterioration of the breakdown voltage characteristic of the second P-N junction 16.

Referring to FIG. 3, the device may become reverse biased when the fourth region 17 is at a more positive potential than the first region 11; for example, a positive potential may be applied to the fourth region 17 while the first region 11 is connected to ground. Stated another way, a negative potential may be applied to first region 11 while the fourth region 17 is connected to ground. These applied potentials cause a depletion region to form in and around the vicinity of the first P-N junction 13 as indicated by cross-hatching 50. Again, an electrical field, indicated by arrows 51, exists across this depletion region which, when large enough, causes the junction 13 to break down. Note that when the device is reverse biased, the first P-N junction 13 is reverse biased, the second P-N junction 16 is forward biased, and the third P-N junction 18 is reverse biased. However, because the third P-N junction 18 is not the critical junction (as explained previously), only the reverse biasing of the first P-N junction 13 need be considered. A negative (relative to the second region 12) potential on contact layer 34 causes the extended portion 28, via the contact layer 25 attached to the first region 11, to create a field in the vicinity of the depletion region surrounding the first P-N junction 13. This potential alters the usual configuration of the electrical field, causing it to be lower at and near the surface 14 than it normally is. This lower electrical field enables a higher bias potential to be applied to the device before breakdown at the junction 13 occurs when the critical field exists at or near the surface 19. The extended portion 28 of contact layer 25 serves to shape the field at the first P-N junction 13; however, the shape of the field is such that a voltage must be applied to extended portion 29 to limit the extent of the field shaping near the surface 14. Application of an appropriate voltage to the inner ring 36, formed in a symmetrical device by contact layer 26 and extended portion 29, prevents the depletion region 50 from reaching the third region 15. The inner ring 36 also prevents an inversion layer from forming between the first and third regions 11 and 15 through the insulating material 19 at the surface 14. In addition, by collecting positive charges present in the insulating layer 19, the inner ring 36 prevents positive charges in the insulating material 19 from accumulating at the surface 14, which could substantially impair the breakdown voltage characteristic of the first P-N junction 13.

It should be understood that although the extended portions 28 and 29 are shown as extended portions of the contact layers 25 and 26 respectively, this is not essential. As long as the metal layer covers the outer areas of space charge or depletion region 40 or 50, it need not be an "extension" of ohmic contact layer 25 or 26.

It should be noted also that when forward biased as shown by FIG. 2, or when reverse biased as shown by FIG. 3, the device has a field that is created between the extended portion 28 and the extended portion 29. The field is such that positively charged particles, which are commonly found in the insulating layer 19, tend to migrate through the insulating layer. These particles are collected by either extended portion 28 or 29 depending upon which (possibly both) is acting as a sink. The built-in field existing between the semiconductor oxide surface and the extended portion 28 or 29 tends to cause positively charged particles, such as positive ions, to collect on the extended portion 28 or 29. This collection of charged particles by the coaction of the field created by the extended portion 28 or 29 and the built-in field results in improved stability of the device. It should be remembered that it is within the broad scope of the invention to employ the built-in field or the field from the portion 28 or 29 prmarily to control the movement of particles to the extended portion 28 or 29. It is also within the broad scope of the invention to increase breakdown voltages at the critical P-N junctions by varying the thickness of the insulating material 19, as described by U.S. patent application Ser. No. 544,229 previously mentioned.

Figure 4:
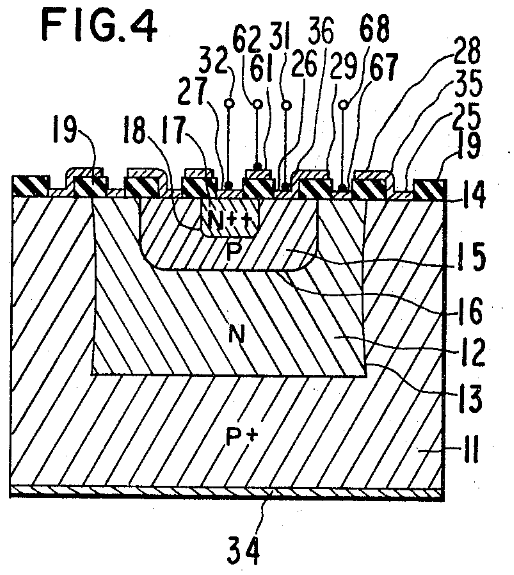
FIG. 4 is a sectional view of an alternate embodiment of the invention.

To appreciate fully the scope of the invention, a first alternative embodiment is presented in FIG. 4. The structure of FIG. 4, which is substantially the same as that of FIGS. 1, 2, and 3, is designated by the same numerals as employed in FIGS. 1, 2, and 3. This embodiment of the invention differs from that shown in FIGS. 1, 2, and 3 by the addition of a fourth contact 67 and lead 68 ohmically connected to the second region 12 for applying a voltage thereto, and by the addition of a third field plate 61 and lead 62 atop the insulating material 19 overlying the third P-N junction 18 for controlling the electric field at the corner of the junction. The scope of the invention is not limited to the embodiments described in detail above, but covers numerous other possible combinations. For example, the first field plate 28 does not have to be an extended portion of contact 25, provided, however, that good ohmic connection is maintained between field plate 28 and contact 25. Similarly, the second field plate 29 and contact 26 may be constructed separately, rather than one being an extension of the other. Whatever embodiment is used, when the device is forward biased, applying a voltage to the field plate overlying the edge of the second P-N junction 16 increases the bias potential the device can withstand before breakdown at junction 16 occurs. Similarly, during reverse bias operation, applying a voltage to the field plate overlying the edge of the first P-N junction 13 increases the bias potential the device can withstand before breakdown at junction 13 occurs.

In summary, the invented multilayered semiconductor device provides higher breakdown voltages than heretofore achieved in planar diffused multilayered constructions, along with improved stability. To emphasize the magnitude of these advantages, a four layer device was tested without the contact layer and field plate construction of this invention, and the results were compared with the identical structure shown in FIG. 1 having contact layers and field plates. The former exhibited breakdown voltages of 450 volts in the forward bias condition and 550 volts in the reverse bias condition, while the latter exhibited breakdown voltages of 600 volts and more in the forward bias condition and 650 volts or more in the reverse bias condition. Breakdown voltage as high as 1,500 volts are possible with the invention.

No effort has been made to exhaust possible embodiments of the invention. It will be understood that the embodiments described in detail are merely illustrative of preferred forms of the invention, and various modifications may be made therein without departing from the scope and spirit of this invention.

What is claimed is:

1. A multilayered semiconductor device having improved stability and high breakdown voltage comprising:
   - a first region of a first conductivity type having a surface;
   - a second region of opposite conductivity type disposed within said first region and forming a first P-N junction therewith, said junction having an edge at said surface;
   - a third region of said first conductivity type disposed within said second region, said second and third regions forming a second P-N junction having an edge at said surface;
   - a fourth region of said opposite conductivity type disposed within said third region forming a third P-N junction, said junction having an edge at said surface;
   - a layer of insulating, protective material overlying at least a portion of said surface including said edges of said first, second, and third junctions and formed to expose a portion of said surface over said first and fourth regions;
   - a first metal contact ohmically connected to said exposed portion of said first region;
   - a second metal contact ohmically connected to said exposed portion of said fourth region;
   - a first field plate atop said insulating, protective material overlying said edge of said first junction, said plate being ohmically connected to said first region; and,
   - a second field plate atop said insulating, protective material overlying said edge of said second junction.

2. The device recited in claim 1 wherein said first field plate is an extension of said first contact.

3. The device recited in claim 1 including a third metal contact ohmically connected to an exposed portion of said third region, with said second field plate being ohmically connected to said contact.

4. The device recited in claim 3 wherein said second field plate is an extension of said third contact.

5. The device recited in claim 3 wherein said first field plate is an extension of said first contact, and said second field plate is an extension of said third contact.

6. The device recited in claim 1 including a fourth contact ohmically connected to an exposed portion of said second region.

7. The device recited in claim 1 including a third field plate atop said insulating material overlying said edge of said third P-N junction.

References Cited

UNITED STATES PATENTS

| | | | |
|---|---|---|---|
| 3,204,160 | 8/1965 | Sah | 317—235 |
| 3,302,076 | 1/1967 | Kang et al. | 317—234 |
| 3,303,059 | 2/1967 | Kerr et al. | 148—1.5 |
| 3,391,287 | 7/1968 | Kao et al. | 317—235 X |

FOREIGN PATENTS

| | | |
|---|---|---|
| 1,400,150 | 4/1965 | France. |
| 6,413,894 | 8/1965 | Netherlands. |

JOHN W. HUCKERT, *Primary Examiner.*

R. F. POLISSACK, *Assistant Examiner.*

U.S. Cl. X.R.

317—234; 307—299, 305